United States Patent [19]
Sarpeshkar et al.

[11] Patent Number: 5,463,348
[45] Date of Patent: Oct. 31, 1995

[54] CMOS LOW-POWER, WIDE-LINEAR-RANGE, WELL-INPUT DIFFERENTIAL AND TRANSCONDUCTANCE AMPLIFIERS

[75] Inventors: Rahul Sarpeshkar; Carver A. Mead, both of Pasadena, Calif.

[73] Assignee: California Institute of Technology, Pasadena, Calif.

[21] Appl. No.: 281,218

[22] Filed: Jul. 27, 1994

[51] Int. Cl.$^6$ ..................................... H03F 3/45
[52] U.S. Cl. .................. 330/253; 330/257; 330/260; 330/307
[58] Field of Search ................. 330/253, 257, 330/260, 307

[56] References Cited

U.S. PATENT DOCUMENTS

| | | | |
|---|---|---|---|
| 4,899,114 | 2/1990 | Berhmer et al. | 330/253 |
| 5,113,092 | 5/1992 | Herold | 330/253 X |

FOREIGN PATENT DOCUMENTS

| | | | |
|---|---|---|---|
| 92008 | 7/1980 | Japan | 330/253 |
| 4192703 | 7/1992 | Japan | 330/253 |

OTHER PUBLICATIONS

C. S. Kim, et al., "New CMOS Linear Transconductor", Electronics Letters, 8–Oct.–92, vol. 28, No. 21, pp. 1962–1964.

F. S. Shoucair, "MOS Amplifier Gain–Bandwidth Enhancement Using Body Signals", 6–Jun.–91, vol. 27, No. 12, pp. 1029–1030.

Z. Wang, et al., "A Voltage–Controllable Linear MOS Transconductor Using Bias Offset Technique", FEB–1990, IEEE Journal of Solid–State Circuits, vol. 25, No. 1, pp. 315–317.

P. Wu, et al., "Tunable Operational Transconductance Amplifier With Extremely High Linearity Over Very Large Input Range", Electronics Letters, 4–Jul.–91, vol. 27, No. 14, pp. 1354–1355.

J. Silva–Martinez, et al., "Design Techniques for High–Performance Full–CMOS OTA–RC Continuous–Time Filters", IEEE Journal of Solid–State Circuits, vol. 27, No. 7, Jul.–92, pp. 993–1001.

R. Alini, et al., "Tunable BiCMOS Continuous–Time Filter for High–Frequency Applications", IEEE Journal of Solid–State Circuits, vol. 27, No. 12, Dec. 1992, pp. 1905–1915.

J. Silva–Martinez, et al., "A Large–Signal Very Low Distortion Transconductor for High–Frequency Continuous–Time Filters", IEEE Journal of Solid–State Circuits, vol. 26, No. 7, Jul.–1991, pp. 946–955.

W. J. Adams, et al., "Extended Transconductance Adjustment/Linearisation Technique", Electronics Letters, 9–May–91, vol. 27, No. 10, pp. 842–844.

J. A. S. Dias, et al., "CMOS Temperature–Stable Linearised Differential Pair", Electronics Letters, 3–Dec.–92, vol. 28, No. 25, pp. 2350–2351.

S.–C. Huang, et al., "Linear Tunable COMFET Transductor", Electronics Letters, 4–Mar.–93, vol. 29, No. 5, pp. 459–461.

(List continued on next page.)

Primary Examiner—James B. Mullins
Attorney, Agent, or Firm—D'Alessandro & Ritchie

[57] ABSTRACT

A novel family of CMOS differential and transconductance amplifiers has wide input linear range and is suited for low power operation. The wide linear range is obtained by "widening the tanh", or decreasing the ratio of transconductance to bias current, by combining the three techniques of (a) using the well terminals of the input differential-pair transistors as the amplifier inputs; (b) using the feedback technique known as source degeneration; and (c) using the novel feedback technique of gate degeneration. According to one preferred embodiment of the present invention a compact transconductance amplifier having a linear range of ±1 V was achieved in an 11-transistor circuit with a DC-input operating range of 1 V–5 V in a low-power subthreshold CMOS technology in a standard 2 micron process.

9 Claims, 7 Drawing Sheets

OTHER PUBLICATIONS

S. Szczepanski, et al., "Linear Transconductor Based On Crosscoupled CMOS Pairs", Electronics Letters, 25–Apr.–91, vol. 27, No. 9, pp. 783–785.

G. Wilson, et al., "Saturation–Mode CMOS Transconductor With Enhanced Tunability and Low Distortion", Electronics Letters, 3–Jan.–91, vol. 27, No. 1, pp. 27–29.

M. C. H. Cheng, et al., "Linear Composite MOSFETS (COMFETs)", Electronics Letters, 26–Sep.–91, vol. 27, No. 20, pp. 1802–1804.

H. Khorramabadi, et al., "High–Frequency CMOS Continuous–Time Filters", IEEE Journal of Solid–State Circuits, vol. SC–19, No. 6, Dec.–84, pp. 939–948.

Y. Tsividis, et al., "MOS Transconductors and Integrators with High Linearity", Electronics Letters, 27–Feb.–86, vol. 22, No. 5, pp. 245–246.

B. Nauta, et al., "Linear CMOS Transconductance Element for VHF Filters", Electronics Letters, 30–Mar.–89, vol. 25, No. 7, pp. 448–450.

S. Szczeppanski, et al., "Differential Pair Transconductor Linearisation Via Electronically Controlled Current–Mode Cells", Electronics Letters, 4–Jun–92, vol. 28, No. 12, pp. 1093–1095.

P. Gray, et al., "Analysis and Design of Analog Integrated Circuits, Second Edition", 1984, pp. 180–186.

G. Wilson, "Linearised Bipolar Transconductor", Electronics Letters, 13–Feb.–92, vol. 28, No. 4, pp. 390–391.

W. Chung, et al., "A Linear Operational Transconductance Amplifier for Instrumentation Applications", IEEE Transactions on Instrumentation and Measurement, vol. 41, No. 3, Jun.–92, pp. 441–443.

J. Ramirez–Angulo, et al., "Programmable BiCMOS Transconductor for Capacitor–Transconductor Filters", Electronics Letters, 18Jun.92, vol. 28, No. 13, pp. 1185–1187.

W. Liu, "An Analog Cochlear Model: Signal Representation and VLSI Realization", Johns Hopkins University Thesis, 1992, pp. 68–70.

Carver Mead, "Analog VLSI and Neural Systems", 1984, pp. 67–82.

X. Arreguit, "Compatible Lateral Bipolar Transistors in CMOS Technology: Model and Applications", Ecole Polytechnique Federale de Lausanne Thesis, 1989, pp. 11–17.

D. Kerns, "Experiments in Very Large–Scale Analog Computation", California Institute of Technology Thesis, 1993, pp. 89–91, 107.

L. Watts, et al., "Improved Implementation of the Silicon Cochlea", IEEE Journal of Solid State Circuits, vol. 27, No. 5, May–92, pp. 692–700.

R. Lyon, "Analog Implementations of Auditory Models", 1991 Darpa Workshop on Speech Recognition and Natural Language, 1991, pp. 1–5.

R. Landee, et al., "Electronic Designers' Handbook", McGraw–Hill Book Co., Inc., 1957, pp. 3–17, 3–18, 3–20 through 3–38.

CMOS LOW-POWER, WIDE-LINEAR-RANGE, WELL-INPUT DIFFERENTIAL AND TRANSCONDUCTANCE AMPLIFIERS

STATEMENT AS TO RIGHTS TO INVENTIONS

The present invention was made with support from the United States Government under Grant N00014-89-J-1675 awarded by the OFFICE OF NAVAL RESEARCH, Department of the Navy. The United States Government has certain rights in the invention.

BACKGROUND OF THE INVENTION

1. Field of the Invention

The present invention relates to integrated semiconductor circuits. More particularly, the present invention relates to a CMOS low-power, wide-linear-range, well-input differential amplifier and transconductance amplifier incorporating a gate degeneration and/or a source degeneration feedback circuit.

2. The Prior Art

In the past few years, there have been many advances in improving the linearity of MOS transconductor circuits. See, e.g., H. Khorramabadi and P. R. Gray, "High Frequency CMOS continuous time filters", I.E.E.E.J. Solid State Circuits, 1984, SC-19(6), pp. 939–948; Y. Tsividis, Z. Czarnul, S. C. Fang, "MOS transconductors and integrators with high linearity", Electronics Letters, 22(5), 1986, pp. 245–246; B. Nauta and E. Seevinck, "Linear CMOS transconductance element for VHF filters", Electronics Letters, 25, 1989, pp. 448–450; S. Szczepanski, J. Jakusz and A. Czarniak, "Differential Pair Transconductor Linearisation via Electronically Controlled Current-Mode Cells", Electronics Letters, 28(12), 1992, pp. 1093–1095.

These advances have primarily been in the area of above-threshold, high-power, high-frequency, continuous-time filters. Though it is possible to implement auditory filters (20 Hz–20 kHz) with these techniques, it is inefficient to do so. The transconductance and current levels in above-threshold operation are so high that large capacitances or transistors with very low W/L are required to create low-frequency poles, and area and power are wasted. In addition, it is hard to span three orders of magnitude of transconductance with a square law, unless transistors with ungainly aspect ratios are used. However, it is easier to obtain a wide linear range above threshold and the noise floor is lower because of the much higher charge and current density levels.

In above-threshold operation, identities like $(x-a)^2-(x-b)^2= (b-a)(2x-a-b)$ are used to increase the wide linear range even further. In bipolar devices where the nonlinearity is exponential rather than second-order, it is much harder to completely get rid of the nonlinearity. The standard solution has been to use the feedback technique of emitter-degeneration which achieves wide linear range by reducing transconductance, and is described by P. R. Gray and R. G. Meyer, "Analysis and Design of Analog Integrated Circuits", 2nd. Ed., pp. 180–186, John Wiley and Sons, 1984. A clever scheme for widening the linear range of a bipolar transconductor, that cancels all nonlinearities up to the fifth order, without reducing the transconductance, has been proposed by G. Wilson, "Linearised Bipolar Transconductor", Electronics Letters, 28(4), 1992, pp. 390–391. A method for getting perfect linearity in a bipolar transconductor by using a translinear circuit and a resistor has been demonstrated by W. Chung, K. Kim and H. Cha, "A Linear Operational Transconductance Amplifier for Instrumentation Applications", I.E.E.E. Trans. on "Instrumentation and Measurement", 41(3), 1992, pp. 441–443. Both of the latter methods, however, require the use of resistors, and ultimately derive their linearity from the presence of a linear element in the circuit. Resistors, however, cannot normally be tuned electronically, and require special process steps.

Some authors have used an MOS device as the resistive element in an emitter-degeneration scheme to make a BiCMOS transconductor, e.g., the scheme proposed by J. Ramirez-Angulo and E. Sánchez-Sinecio, "Programmable BiCMOS Transconductor for Capacitor-Transconductor Filters", Electronics Letters, 28(13), 1992, pp. 1185–1187. Another BiCMOS technique, reported by W. Liu, "An Analog Cochlear Model: Signal Representation and VLSI Realization", Ph.D. Thesis, Johns Hopkins University, Baltimore, Md., 1992, uses an above-threshold differential pair to get wide linearity and scales down the output currents via a bipolar Golbert gain cell, to levels more appropriate for auditory frequencies. Above-threshold differential pairs, however, require techniques like cascode mirrors to improve the output conductance. These mirrors, however, degrade DC-output voltage operating range and consume chip area. In addition, above-threshold operation results in higher power dissipation.

Thus far, we have discussed the prior art pertaining to high power (typically greater than 1 micro watt) transconductors in above-threshold MOS and bipolar technologies. We now discuss the prior art pertaining to low power (typically less than 1 micro watt) subthreshold MOS transconductors. Two transconductance amplifiers well-known to those of ordinary skill in the art are described in "Analog VLSI and Neural Systems", C. Mead, Addison Wesley, 1989, pp. 67–82. Both have linear ranges of approximately 75 mV. Subthreshold MOS technology, like bipolar technology, is based on exponential nonlinearities. Thus, it is natural to employ source degeneration techniques to widen the linear range. Methods for getting wider linear range that exploit the Early effect in conjunction with a source degeneration method are described by X. Arreguit, "Compatible Lateral Bipolar Transistors in CMOS Technology: Model and Applications", Ecole Polytechnique Federale de Lausanne DSc Thesis, These no. 817, 1989. The Early voltage is, however, a parameter with high variance across transistors, and thus, one cannot expect to get good transconductance matching in this method. Further, such schemes are highly offset-prone, because any current mismatch manifests itself as a large voltage mismatch due to the exceptionally low transconductance.

The simple technique of using a diode as a source degeneration element extends the linear range of a differential pair to about ±150 mV, as described by L. Watts, D. A. Kerns, R. F. Lyon and C. A. Mead, "Improved Implementation of the silicon cochlea", I.E.E.E. Journal of Solid State Circuits, 27(5), May, 1992, pp. 692–700. However, it is difficult to increase this linear range further by using two stacked diodes in series as the degeneration element—the wider linear range that is achieved is obtained at the expense of a large loss in DC-input operating range. If one is constrained to operate within a 0–5 V supply, the signal levels remain constrained to take on small values because of the inadequate DC-input operating range.

It is tempting to think that the problem of getting wider linear range may be solved by interposing a capacitive divider between each input from the outside world and each input to the amplifier. (Of course, some form of slow adaptation is necessary to ensure that the DC-value of each floating input of the amplifier is constrained.) This approach is described by R. F. Lyon, "Analog Implementations of Auditory Models", DARPA Workshop on Speech and Natural Language, Morgan Kaufmann Publishers, San Mateo, Calif., 1991. However, the use of the capacitive divider implies that the signals entering the amplifier from the outside world get attenuated at its inputs, but the internal noise present at the amplifier's inputs remains the same. Assuming that the dominant noise is due to the internal noise of the amplifier, which is usually the case, the signal to noise ratio is worsened by exactly the same factor that the linear range is increased. Thus no gain in dynamic range whatsoever is achieved—the signal levels and the noise levels are scaled by the same factor. Further, the scheme did not work well in practice because of its sensitivity to circuit parasitics.

OBJECTS AND ADVANTAGES OF THE INVENTION

The linear range of approximately ±75 mV of traditional low power subthreshold transconductance amplifiers is too small for some applications, e.g., for filters in electronic cochleas where it is desirable to handle loud sounds without distortion and still maintain a large dynamic range.

Accordingly, it is an object of the present invention to provide a novel CMOS wide linear range differential amplifier suitable for low power operation (less than a microwatt). If the amplifier is operated at higher bias currents, it may be used for high power operation (more than a microwatt) as well, but with some loss in DC-input operating range.

It is a further object of the present invention to provide a novel CMOS wide linear range transconductance amplifier with a linear range of the order of 600 mV to 1000 mV and more, while still maintaining a DC-input operating range of 1 V–5 V.

It is a further object of the present invention to provide a CMOS wide linear range transconductance amplifier incorporating a novel gate degeneration feedback circuit and/or a source degeneration feedback circuit.

Yet a further object of the present invention is to provide a novel CMOS wide linear range transconductance amplifier incorporating well input to the differential pair.

These and many other objects and advantages of the present invention will become apparent to those of ordinary skill in the art from a consideration of the drawings and ensuing description of the invention.

CONVENTIONS AND DEFINITIONS USED IN THIS DOCUMENT

The "grounded-substrate convention" is used herein and described below. It is used in order to provide a more concise description of the invention, and to avoid the unnecessary duplication of description for identical circuits that have merely been fabricated in N-well or P-well technologies.

According to the "grounded-substrate convention", a transistor drawn without a bubble on its gate refers to a native transistor in the semiconductor substrate, and is called a native transistor. A transistor drawn with a bubble on its gate denotes a transistor in the well, and is called a well-type transistor. The semiconductor substrate is always tied to a reference potential, referred to as "Ground." In an N-well process, the wells are tied to potentials more positive than Ground and the power supply used in the circuit, called $V_{DD}$, is more positive than Ground. In a P-well process, the wells are tied to potentials more negative than Ground, and the power supply used in the circuit, $V_{DD}$, is more negative than Ground. With these conventions, circuits drawn for an N-well process are automatically valid in a P-well process as well, if the signs of all potentials, including $V_{DD}$, are reversed. The conventions automatically ensure that well-substrate junctions are always reverse-biased.

Thus, in an N-well process, well-type transistors are p-channel transistors in the well, native transistors are n-channel transistors in the substrate, and $V_{DD}$ and all voltages in the circuit are positive. In a P-well process, well-type transistors are n-channel transistors in the well, native transistors are p-channel transistors in the substrate, and $V_{DD}$ and all voltages in the circuit are negative. It is simplest to read all circuit diagrams, treating all transistors as having been fabricated in an N-well process, with all voltages positive, all native transistors being n-channel devices, all well-type transistors being p-channel devices and with the substrate grounded; it is then understood that the diagram is also valid for a P-well process, with all the voltages negative, all native transistors being p-channel devices, all well-type transistors being n-channel devices and with the substrate grounded.

A "feedback transistor" is a transistor having its gate and its drain connected to one another.

BRIEF DESCRIPTION OF THE INVENTION

The present invention incorporates a novel technique of well-input to a differential pair of transistors, in various combinations with the known technique of source degeneration and/or a novel technique of gate degeneration, to reduce transconductance and thereby lead to the advantages as set forth above.

According to a first aspect of the present invention, a CMOS low-power, wide-linear-range, well-input differential amplifier with gate-degeneration (such as the novel differential amplifier shown in FIG. 1) may be integrated onto a single semiconductor substrate and includes: (1) first and second well-type differential transistors disposed in, respectively, first and second wells; each differential transistor has a source connected to a bias current source, a gate and a drain connected together, and the first and second wells are connected to, respectively, first and second voltage input nodes and are electrically isolated from each other; (2) first and second native feedback transistors each having a drain connected to the drain of the first and second well-type differential transistors, respectively, and a source connected to Ground; and (3) first and second output nodes connected to the gates and drains of the first and second native feedback transistors, respectively.

According to a second aspect of the present invention a CMOS low-power, wide-linear-range, well-input differential amplifier with source degeneration and gate degeneration (such as the novel differential amplifier shown in FIG. 2) may be integrated onto a single semiconductor substrate and includes: (1) first and second well-type feedback transistors disposed in, respectively, first and second wells (which may be the same well), each having a source connected to a bias current source, and a gate and a drain connected together, wherein the first and second wells are both connected to $V_{DD}$; (2) first and second well-type differential transistors disposed in, respectively, third and fourth wells, each having a source connected to both the gate and the drain of the first and second well-type feedback transistors, respectively, and a gate and a drain connected together, wherein the third and fourth wells are connected to, respectively, first and second voltage input nodes and are electrically isolated from each other and from the first and second wells; (3) first and second native feedback transistors, each having a gate and a drain connected together and to both the gate and the drain of the first and second well-type differential transistors, respectively, and a source connected to Ground; and (4) first and second output nodes connected to the gates and drains of the first and second native feedback transistors, respectively.

According to a third aspect of the present invention a CMOS low-power, wide-linear-range, well-input and gate-grounded differential amplifier (such as the novel differential amplifier shown in FIG. 3) may be integrated onto a single semiconductor substrate and includes: (1) first and second well-type feedback transistors disposed in, respectively, first and second wells (which may be the same well), each having a source connected to a bias current source, and a gate and a drain connected together, wherein the first and second wells are both connected to $V_{DD}$; (2) first and second well-type differential transistors disposed in, respectively, third and fourth wells, each having a source connected to both the gate and the drain of the first and second well-type MOS feedback transistors, respectively, a gate connected to Ground, and a drain, wherein the third and fourth wells are connected to, respectively, first and second voltage input nodes and are electrically isolated from each other and from the first and second wells; (3) first and second native feedback transistors, each having a gate and a drain connected together and to the drain of the first and second well-type differential transistors, respectively, and a source connected to Ground; and (4) first and second output nodes connected to the gates and drains of the first and second native feedback transistors, respectively. Grounding the gate in the amplifier results in a very large DC-input operating range that stretches from a voltage very near Ground to $V_{DD}$.

According to a fourth aspect of the present invention a CMOS low-power, wide-linear-range, well-input and gate-input differential amplifier with gate-degeneration (such as the novel differential amplifier shown in FIG. 1A) may be integrated onto a single semiconductor substrate and includes: (1) first and second well-type differential transistors disposed in, respectively, first and second wells, each having a source connected to a bias current source, a gate connected to, respectively, a first and a third voltage input node, and a drain, wherein the first and second wells are connected to, respectively, a second and a fourth voltage input node and are electrically isolated from each other; (2) first and second native feedback transistors, each having a gate and a drain connected together and to the drain of the first and second well-type differential transistors, respectively, and a source connected to Ground; and (3) first and second output nodes connected to the gates and drains of the first and second native feedback transistors, respectively.

According to a fifth aspect of the present invention a CMOS low-power, wide-linear-range, well-input and gate-input differential amplifier with source-degeneration and gate-degeneration (such as the novel differential amplifier shown in FIG. 2A) may be integrated onto a single semiconductor substrate and includes: (1) first and second well-type feedback transistors disposed in, respectively, first and second wells (which may be the same well), each having a source connected to a bias current source, and a gate and a drain connected together, wherein the first and second wells are connected to $V_{DD}$; (2) first and second well-type differential transistors disposed in, respectively, third and fourth wells, each having a source connected to both the gate and the drain of the first and second well-type feedback transistors, respectively, a gate connected to, respectively, a first and a third voltage input node, and a drain, wherein the third and fourth wells are connected to, respectively, a second and a fourth voltage input node and are electrically isolated from each other and from the first and second wells; (3) first and second native feedback transistors, each having a gate and a drain connected together and to the drain of the first and second well-type differential transistors, respectively, and a source connected to Ground; and (4) first and second output nodes connected to the gates and drains of the first and second native feedback transistors, respectively.

In accordance with the fourth and fifth aforementioned aspects of the present invention, the first and third voltage input nodes (on the gates of the differential pair) may be connected to a fixed voltage source while the second and fourth voltage input nodes (on the wells of the differential pair) are driven. Alternatively, the wells may be connected to a source of a fixed voltage and the gates driven.

Figure 4:
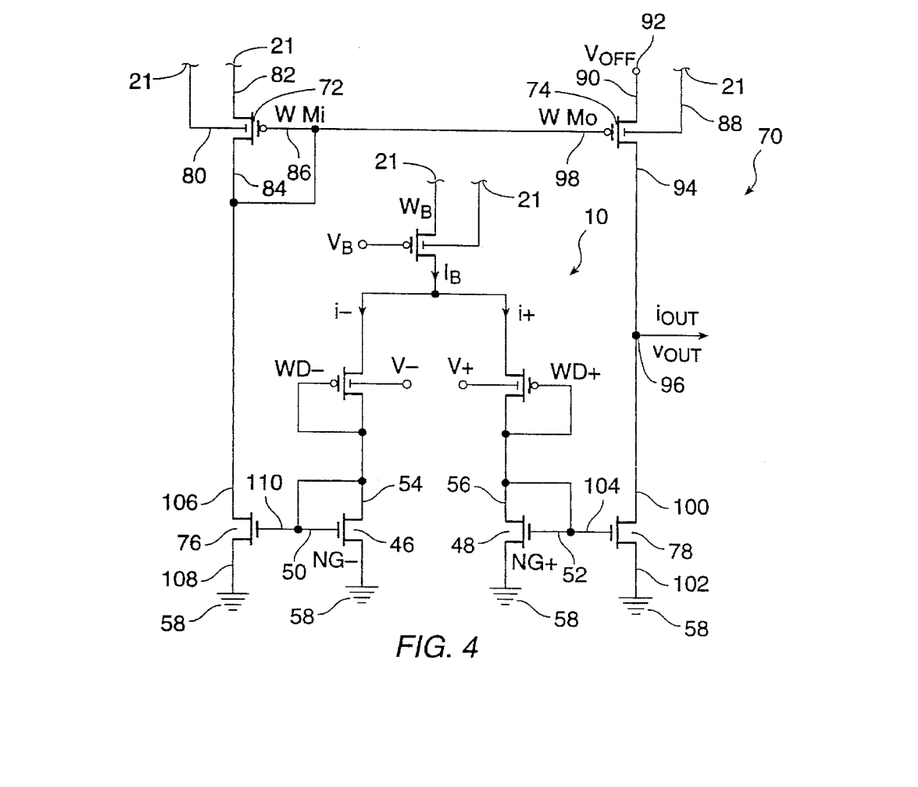
FIGS. 4, 5, and 6, respectively, are schematics of transconductance amplifiers according to FIGS. 1, 2 and 3 including current mirrors.
Figure 5:
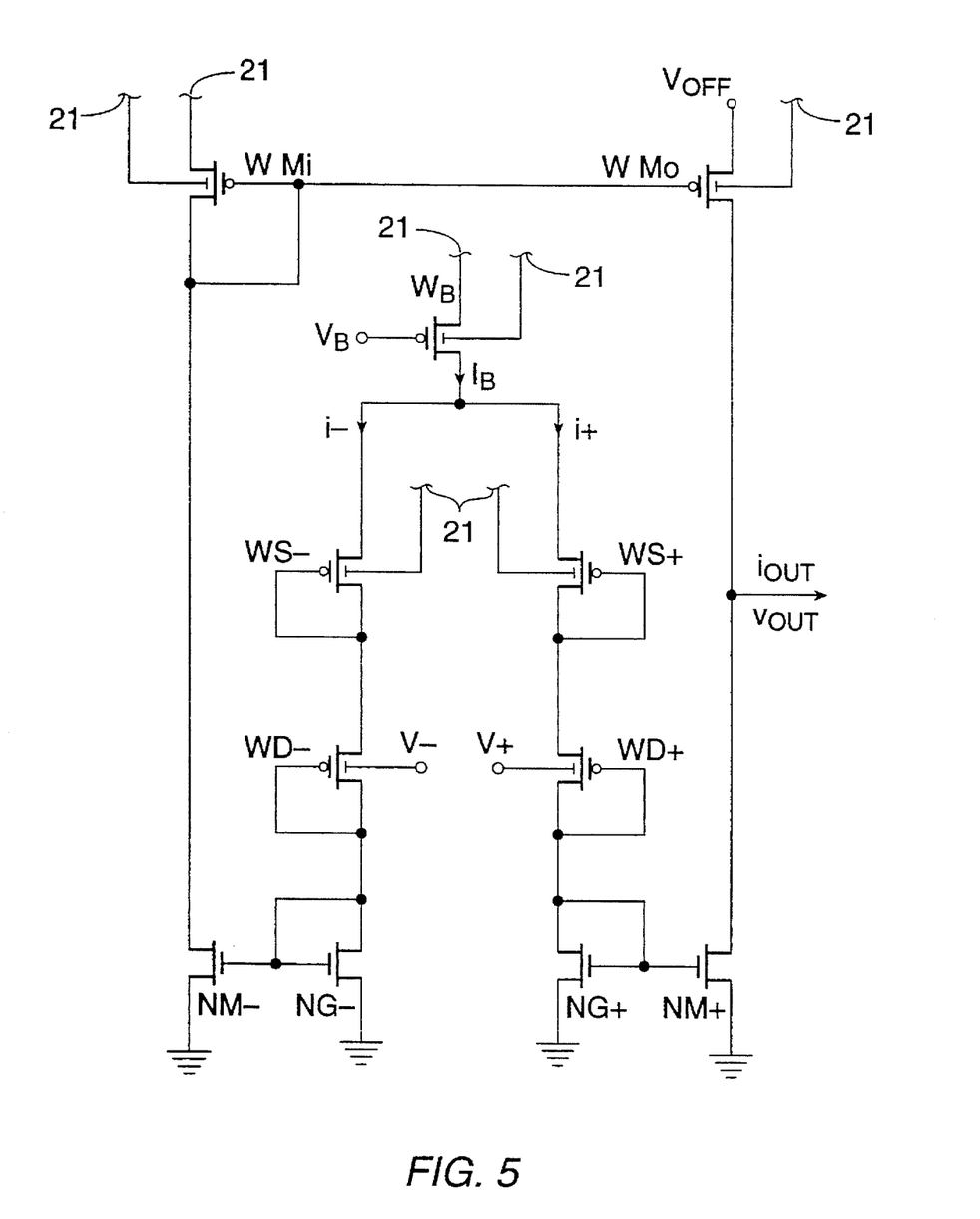
Figure 6:
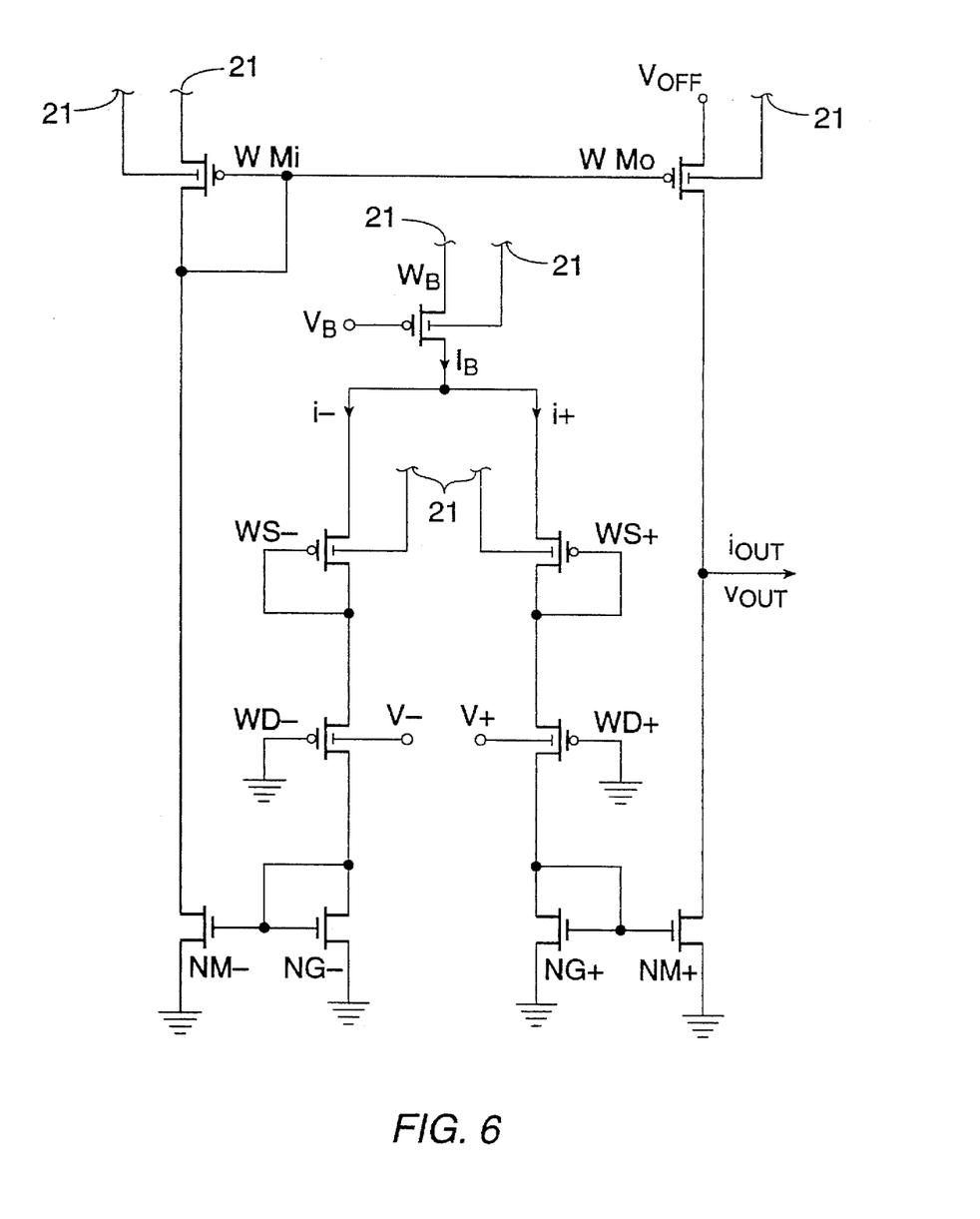

To each of the aforementioned aspects of the invention may be added a current mirror arrangement in order to construct a transconductance amplifier (such as the transconductance amplifiers shown in FIG. 4, FIG. 5 and FIG. 6). The current mirror arrangement may be constructed of: (1) first and second well-type current mirror transistors disposed in additional wells (which may be the same well and may be in common with all wells but the wells in which the well-type differential transistors are disposed), the first well-type current mirror transistor having a source connected to $V_{DD}$, and a gate and a drain connected together, the second well-type current mirror transistor having a source connected to an offset voltage power supply, which may be the same as $V_{DD}$, a gate connected to the gate of the first well-type current mirror transistor, a drain connected to an output terminal, wherein the additional well(s) are connected to $V_{DD}$ and are electrically isolated from the wells of the well-type differential transistors; and (2) first and second native current mirror transistors, the first native current mirror transistor having a drain connected to the gate and drain of the first well-type current mirror transistor and gate of the second well-type current mirror transistor, a gate connected to the gate and drain of the first native feedback transistor, and a source connected to Ground, and the second native current mirror transistor having a drain connected to the output terminal, a gate connected to the gate and drain of the second native feedback transistor, and a source connected to Ground.

In each of the aforementioned aspects of the invention the bias current source may be formed of a well-type bias transistor disposed in an additional well (which may be in common with all wells of similar conductivity but the well-type differential transistor wells), which has a gate connected to a bias voltage power supply, a source connected to the $V_{DD}$, and a drain connected to provide a bias current to the differential amplifier, wherein the additional well is connected to $V_{DD}$ and is electrically isolated from the wells of the well-type differential transistors.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

The following is a description of the presently preferred embodiments for differential amplifiers and corresponding transconductance amplifiers designed for low-power subthreshold operation with a wide input linear range. The wide linear range is obtained by "widening the tanh", or decreasing the ratio of transconductance to bias current, by combining three techniques. The well terminals of the input differential-pair transistors are used as the amplifier inputs. Feedback techniques known as source degeneration (a technique common in other circuits) and gate degeneration (a new technique) provide further improvements. For example, according to one preferred embodiment of the present invention the transconductance reduction is achieved in a compact 11-transistor circuit without degrading other characteristics like DC-input operating range.

Figure 7A:
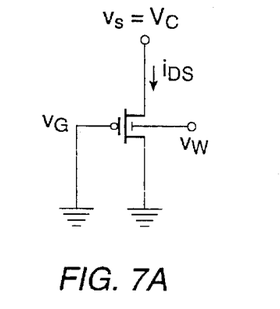
FIG. 7A shows a circuit fragment incorporating the well-input technique for reducing transconductance.

The strategy pursued for obtaining low transconductance begins with picking an input terminal that is gifted with low transconductance from birth; i.e., the well. The well terminal is generally preferred as the input terminal in amplifiers fabricated according to the present invention because the dependence of the drain current on well voltage is more gentle than its dependence upon gate voltage. Hence the transconductance is lowered. FIG. 7A shows a circuit configuration where the well is used as an input. The gate is tied to Ground (in this version) in order to permit as wide a range of DC-input operation as possible, and the source is biased to a voltage $V_C$ such that $i_{DS}$ is a subthreshold current.

Figure 7B:
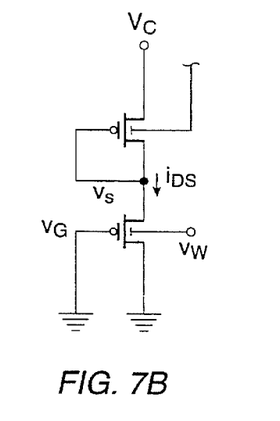
FIG. 7B shows a circuit fragment incorporating the source degeneration feedback technique for reducing transconductance.

The transconductance is then further reduced by using the technique of source degeneration. The technique of source degeneration is well known and was first used in vacuum-tube design where it was referred to as "cathode degeneration", see, e.g., R. W. Landee, D. C. Davis, and A. P. Albrecht, Electronic Designers Handbook, McGraw-Hill Book Co., New York, 1957, pp. 3–18 to 3–38. More recently it was used in bipolar design, where it is referred to as "emitter degeneration", see, e.g., P. R. Gray and R. G. Meyer, "Analysis and Design of Analog Integrated Circuits", 2nd ed., pp. 180–186, John Wiley & Sons, 1984. The basic idea is to take the current flowing through a transistor, convert it to a voltage by dropping it across a resistor or diode, and feed this voltage back to the emitter or source of the transistor to decrease its current. FIG. 7B shows a circuit configuration that illustrates source degeneration. The voltage $V_C$ is such that $i_{DS}$ is a subthreshold current.

Figure 7C:
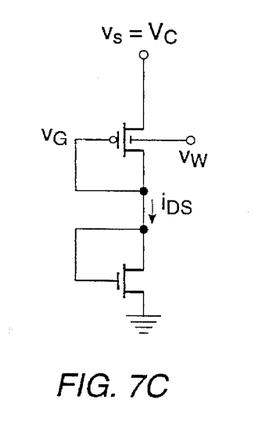
FIG. 7C shows a circuit fragment incorporating the gate degeneration feedback technique for reducing transconductance.

Finally, a new negative-feedback technique, termed "gate degeneration," is used to reduce transconductance even further. The technique of gate degeneration has not been used previously, probably because most designs use the gate as an input and never have it free to degenerate. The vacuum tube literature was, however, familiar with a similar concept called "screen degeneration", described, e.g., by R. W. Landee, D. C. Davis, and A. P. Albrecht, Electronic Designers Handbook, McGraw-Hill Book Co., New York, 1957, pp. 3–18 to 3–38. The idea behind gate degeneration is to take the current flowing through a transistor, convert it to a voltage by dropping it across a diode, and feed this voltage back to the gate of the transistor to decrease its current. FIG. 7C shows the circuit configuration. The voltage $V_C$ is such that $i_{DS}$ is a subthreshold current. The gate voltage is only a subthreshold diode drop above Ground, so a large range of DC-input operation is still obtained.

The complete transconductance amplifier circuit that incorporates all three techniques is shown in FIG. 5. In a standard 2 micron CMOS N-well process with a 5 V power supply, a linear range of ±1 V, a DC-input operating range of 1 V–5 V, and low offsets of a few mV were obtained using the device shown in the circuit of FIG. 5, illustrated by experimental data in FIG. 8.

While all three techniques can be used to achieve maximum linear range of around ±1000 mV or more with a standard 2 micron CMOS process, combinations of fewer than all of these techniques can yield significant improvement over prior art transconductance amplifiers having a maximum linear range on the order of about ±75 mV.

The conventions used in the accompanying figures are as follows. With respect to transistor naming conventions, well-type transistors' names begin with a "W" and native transistors' names begin with an "N". The second letter in the name gives a mnemonic indication of the primary function of the transistor. Thus $NM_-$, $NM_+$, $WM_i$, and $WM_o$ all have "M" as their second letter because they all form parts of current mirrors. Subscripts on the name add further information. Thus $WM_i$ is the input transistor of a current mirror and $WM_o$ is the output transistor of the same mirror. The $v_+$ and $v_-$ inputs of the amplifier are the wells of the differential-pair transistors $WD_-$ and $WD_+$. The feedback transistors $WS_+$ and $WS_-$ reduce the transconductance of the differential pair transistors through source degeneration. The feedback transistors $NG_-$ and $NG_+$ reduce the transconductance of the differential-pair transistors through gate degeneration. They also serve as input transistors of the current mirrors. The bias transistor WB supplies the bias current for the amplifier. The bias current is controlled by the voltage $V_B$. The output current and voltage are labelled $i_{out}$ and $v_{out}$ respectively. The offset voltage $V_{OFF}$ controls the gain of the $WM_I$–$WM_o$ current mirror and may thus be used to trim the voltage offset of the amplifier.

Figure 1:
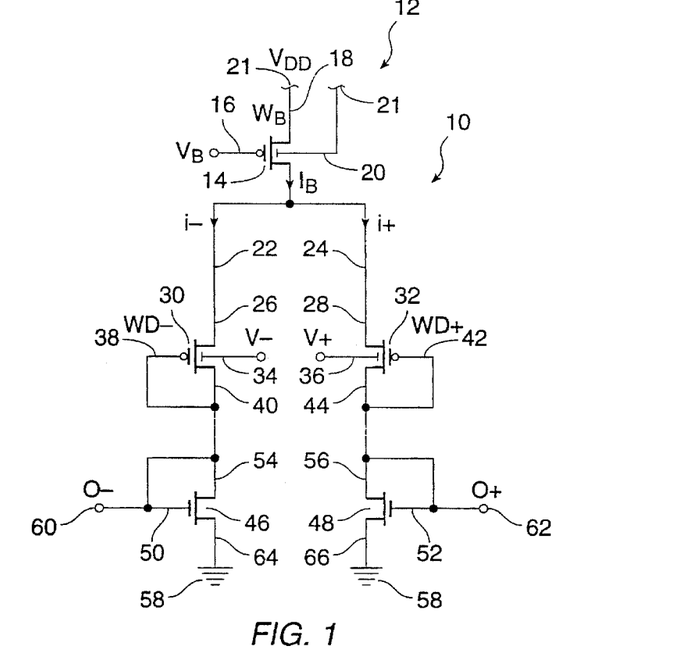
FIG. 1 is a schematic diagram of a differential amplifier according to a first preferred embodiment of the present invention which incorporates well inputs and gate degeneration.

Turning now to FIG. 1, a differential amplifier 10 is shown which is disposed in a semiconductor substrate. This differential amplifier makes use of the techniques of well-input and gate degeneration. Differential amplifier 10 comprises a current source 12 which is preferably a well-type transistor 14, with its gate 16 tied to a bias voltage source, $V_B$, a source 18 and well 20 tied to supply voltage $V_{DD}$ 21, and a drain providing a source of bias current $I_B$ for the differential amplifier 10.

The bias current is supplied along two branches of the circuit 22, 24 to sources 26, 28 of, respectively, of well-type differential transistors 30, 32. According to this embodiment of the invention, the wells 34, 36 of transistors 30, 32, respectively, serve as voltage input nodes. Transistor 30 has its gate 38 tied to its drain 40. Similarly, transistor 32 has its gate 42 tied to its drain 44.

Native transistors 46, 48 have their gates 50, 52, respectively, tied to their drains 54, 56, respectively, which are connected, respectively, to the gates 38, 42 and drains 40, 44 of well-input differential transistors 30, 32. The sources 64, 66 of native transistors 46, 48, respectively, are both connected Ground 58. The output of differential amplifier 10 is available at terminals 60, 62 which are connected, respectively to the gates and drains of native transistors 46, 48.

FIG. 4 depicts the transconductance amplifier version of the differential amplifier 10 of FIG. 1 further comprising a current mirror arrangement 70 comprising a first well-type current mirror transistor 72, a second well-type current mirror transistor 74, a first native transistor 76 and a second native transistor 78.

The well 80 and source 82 of transistor 72 are tied to supply rail $V_{DD}$ 21; its drain 84 is tied to its gate 86.

The well 88 of transistor 74 is tied to supply rail $V_{DD}$ 21; the source 90 is tied to an offset voltage rail 92, $V_{OFF}$, which may be set to a value very near to $V_{DD}$ and may be used to trim the small offset voltage in the differential amplifier to zero if desired. The differential amplifier may be operated with the offset voltage identical to $V_{DD}$ ($V_{OFF}$=$V_{DD}$) if the user is willing to tolerate a few mV of offset; the drain 94 is connected to output node 96; and the gate 98 is connected to gate 86 and drain 84 of transistor 72.

The drain 100 of transistor 78 is connected to output node 96; its source 102 is connected to Ground 58; and its gate 104 is connected to gate 52 and drain 56 of transistor 48 of differential amplifier 10.

The drain 106 of transistor 76 is connected to drain 84 and gate 86 of transistor 72 as well as gate 98 of transistor 74; source 108 of transistor 76 is connected to Ground 58; and gate 110 is connected to gate 50 and drain 54 of transistor 46 of differential amplifier 10.

Figure 1A:
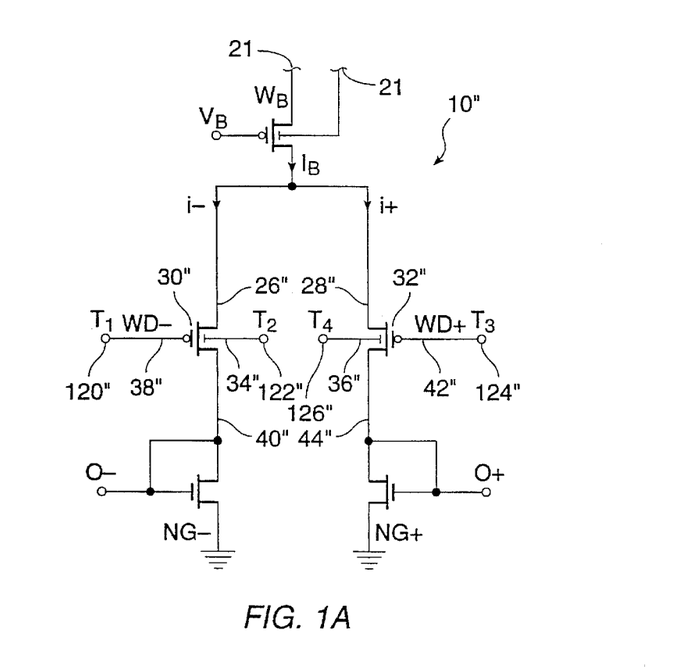
FIG. 1A is a schematic diagram of a differential amplifier according to a second preferred embodiment of the present invention which incorporates gate and well inputs and gate degeneration.

FIG. 1A depicts a modification 10" of the FIG. 1 circuit wherein the differential well-type transistors 30", 32" are modified so that transistor 30" comprises a source 26" connected to the bias current source, a drain 40", a gate 38" connected to a first voltage input node 120", and a well 34" connected to a second voltage input node 122"; transistor 32" comprises a source 28" connected to the bias current source, a drain 44", a gate 42" connected to a third voltage input node 124", and a well 36" connected to a fourth voltage input node 126". In this embodiment of the present invention, the gates of transistors 30", 32" are not connected to either source or drain thereof. Pursuant to this embodiment of the invention, input nodes 120", 124" may be tied to a fixed voltage and input nodes 122", 126" may serve as the voltage input nodes to the differential amplifier. The fixed voltage may be $V_{DD}$, Ground, or an intermediate value. Alternatively, input nodes 122", 126" may be tied to a fixed voltage value with input nodes 120", 124" serving as the voltage input nodes to the differential amplifier. The particular choice of fixed voltage used determines the DC-input operating range of the differential pair in either case. A current mirror arrangement, as described before, may be used in conjunction with this embodiment as well.

Figure 2:
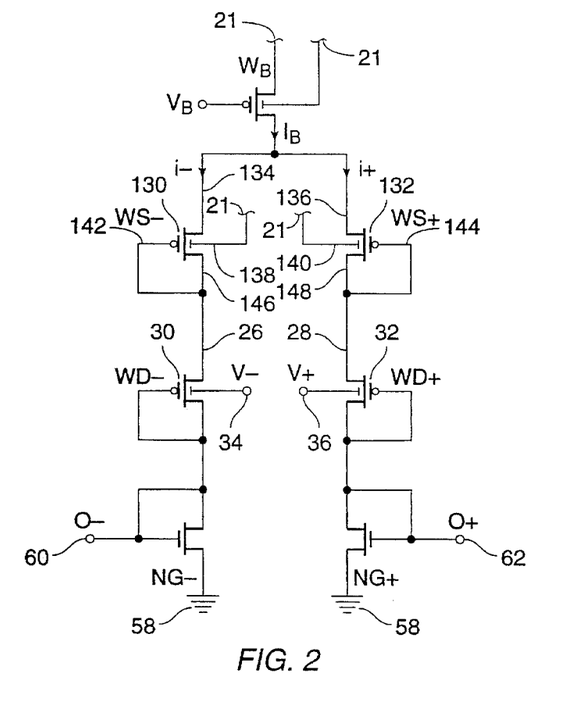
FIG. 2 is a schematic diagram of a differential amplifier according to a third preferred embodiment of the present invention which incorporates well inputs, source degeneration and gate degeneration.

FIG. 2 depicts an embodiment of the present invention which utilizes well-input, source degeneration and gate degeneration. It is identical to the FIG. 1 embodiment except in the portion of the circuit located between the bias current source and the differential pair. Thus, to avoid over-complicating the disclosure, the duplicate portions of the circuit will not be re-described here.

The circuit further comprises well-type source degeneration feedback transistors 130, 132. The source 134, 136 of each is tied to the bias current source, the well 138, 140 of each is tied to $V_{DD}$ 21, each has a gate 142, 144 tied to a respective drain 146, 148 which is in turn tied, respectively, to the drains 26, 28 of transistors 30, 32, which, in this embodiment are NOT tied directly to the bias current source as it was in FIG. 1.

FIG. 5 depicts the circuit of FIG. 2 with the addition of current mirrors to convert the differential amplifier of FIG. 2 into a transconductance amplifier.

Figure 2A:
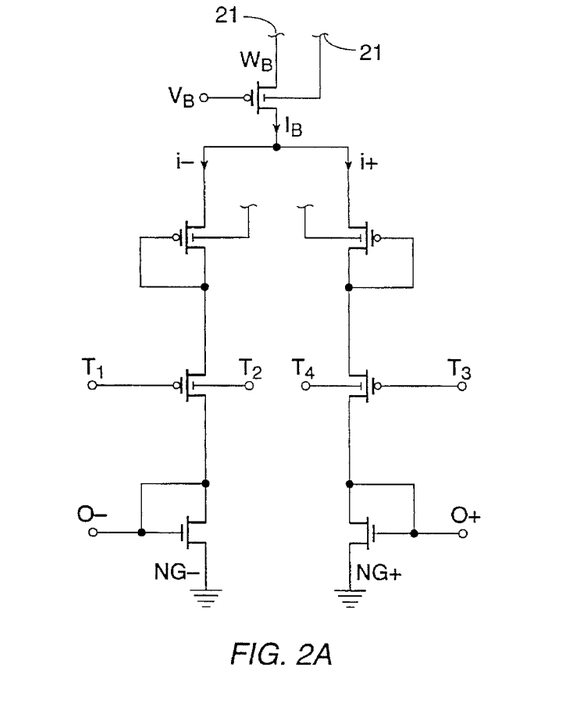
FIG. 2A is a schematic diagram of a differential amplifier according to a fourth prefer red embodiment of the present invention which incorporates gate and well inputs and source degeneration.

FIG. 2A depicts the circuit of FIG. 2 modified to incorporate the four terminal voltage input feature of FIG. 1A.

Figure 3:
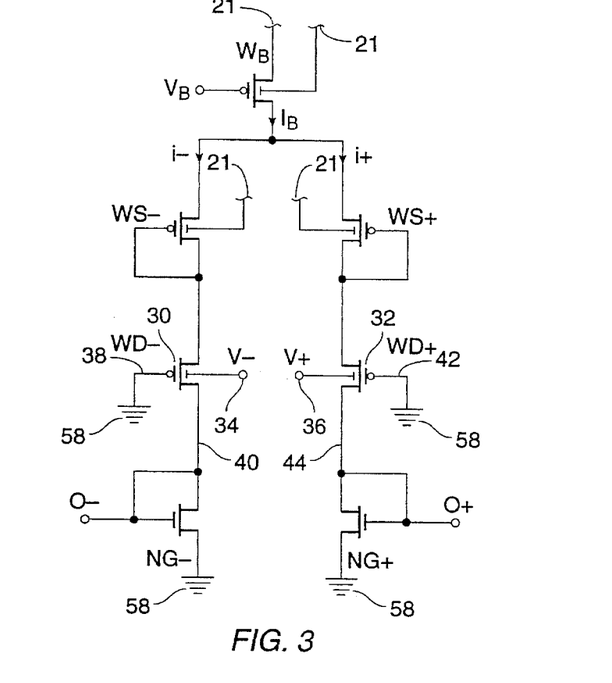
FIG. 3 is a schematic diagram of a differential amplifier according to a third preferred embodiment of the present invention which incorporates well inputs, gate inputs tied to Ground, and source degeneration.

FIG. 3 depicts the circuit of FIG. 2 modified so that gate 38 of transistor 30 and gate 42 of transistor 32 are each tied to Ground 58. According to this embodiment of the invention, the gates 38, 42 are not connected, respectively, to the drains 40, 44 of the differential pair transistors 30, 32 as they were in FIG. 2.

FIG. 6 depicts the circuit of FIG. 3 with the addition of current mirrors to convert the differential amplifier of FIG. 3 to a transconductance amplifier.

Figure 8:
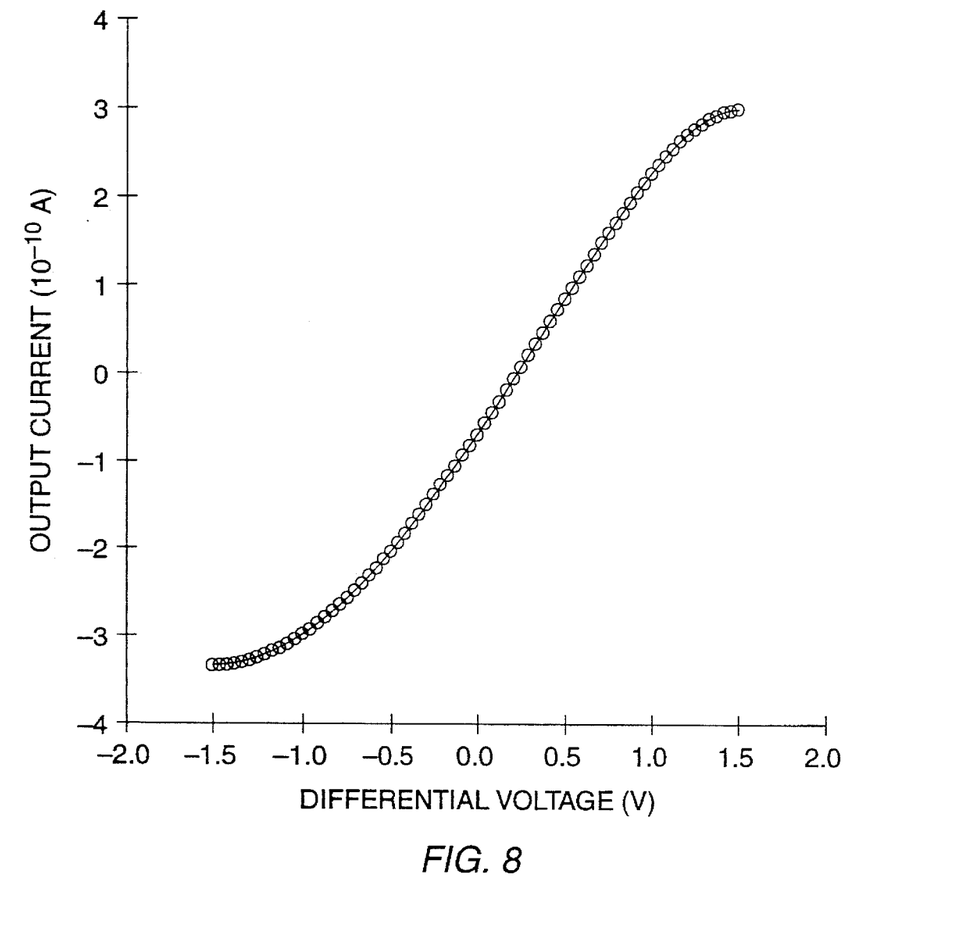
FIG. 8 shows the hyperbolic tangent ("tanh") relationship between the output current and the input differential voltage for a transconductance amplifier according to the embodiment shown in FIG. 5, fabricated according to the present invention in a standard 2 micron CMOS N-well process.

FIG. 8 depicts a measured I–V plot of output current vs. input differential voltage for a transconductance amplifier constructed in accordance with the FIG. 5 embodiment of the present invention in a 2 micron CMOS N-well process. The linear range of the circuit can be seen to be about ±1.0 V. The I–V performance of the transconductance amplifier is conveniently fit by a hyperbolic tangent curve.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. A differential amplifier disposed in a semiconductor substrate, said differential amplifier comprising:

a bias current source;

a first well-type differential transistor disposed in a first well having a source connected to said bias current source, and a gate and a drain connected together, wherein said first well is connected to a first voltage input node;

a second well-type differential transistor disposed in a second well having a source connected to said bias current source, and a gate and a drain connected together, wherein said second well is connected to a second voltage input node;

a first native feedback transistor having a gate and a drain connected together and to both said gate and said drain of said first well-type differential transistor, and a source connected to Ground, a second native feedback transistor having a gate and a drain connected together and to both said gate and said drain of said second well-type differential transistor, and a source connected to Ground;

a first output node connected to said gate and said drain of said first native feedback transistor; and a second output node connected to said gate and said drain of said second native feedback transistor.

2. A differential amplifier disposed in a semiconductor substrate, said differential amplifier comprising:

a bias current source;

a first well-type feedback transistor disposed in a first well having a source connected to said bias current source, and a gate and a drain connected together, wherein said first well is connected to a second well-type feedback transistor disposed in a second well having a source connected to said bias current source, and a gate and a drain connected together, wherein said second well is connected to $V_{DD}$;

a first well-type differential transistor disposed in a third well having a source connected to both said gate and said drain of said first well-type feedback transistor, and a gate and a drain connected together, wherein said third well is connected to a first voltage input node and is electrically isolated from both said first well and said second well;

a second well-type differential transistor disposed in a fourth well having a source connected to both said gate and said drain of said second well-type feedback transistor, and a gate and a drain connected together, wherein said fourth well is connected to a second voltage input node and is electrically isolated from both said first well, said second well and said third well;

a first native feedback transistor having a gate and a drain connected together and to both said gate and said drain of said first well-type differential transistor, and a source connected to Ground;

a second native feedback transistor having a gate and a drain connected together and to both said gate and said drain of said second well-type differential transistor, and a source connected to Ground;

a first output node connected to said gate and said drain of said first native feedback transistor; and a second output node connected to said gate and said drain of said second native feedback transistor.

3. A differential amplifier disposed in a semiconductor body of a first conductivity type, said differential amplifier comprising:

a bias current source;

a first well-type feedback transistor having a source connected to said bias current source, and a gate and a drain connected together, wherein said first well is connected to $V_{DD}$;

a second well-type feedback transistor having a source connected to said bias current source, and a gate and a drain connected together, wherein said second well is connected to $V_{DD}$;

a first well-type differential transistor disposed in a third well having a source connected to both said gate and said drain of said first well-type feedback transistor, a gate connected to a first voltage input node, and a drain, wherein said third well is connected to a second voltage input node and is electrically isolated from both said first well and said second well;

a second well-type differential transistor disposed in a fourth well having a source connected to both said gate and said drain of said second well-type feedback transistor, a gate connected to a third voltage input node, and a drain, wherein said fourth well is connected to a fourth voltage input node and is electrically isolated from both said first well, and said second well and said third well;

a first native feedback transistor having a gate and a drain connected together and to said drain of said first well-type differential transistor, and a source connected to Ground;

a second native feedback transistor having a gate and a drain connected together and to said drain of said second well-type differential transistor, and a source connected to Ground;

a first output node connected to said gate and said drain of said first native feedback transistor; and a second output node connected to said gate and said drain of said second native feedback transistor.

4. A differential amplifier according to claim 3 wherein said first voltage input node and said third voltage input node are connected to a power supply rail set to a voltage different from Ground, and different from $V_{DD}$.

5. A differential amplifier according to claim 3 wherein said second voltage input node and said fourth voltage input node are connected to a third power supply rail set to a voltage different from Ground and different from $V_{DD}$.

6. A differential amplifier disposed in a semiconductor substrate, said differential amplifier comprising:

a bias current source;

a first well-type feedback transistor disposed in a first well body having a source connected to said bias current source, and a gate and a drain connected together, wherein said first well is connected to a $V_{DD}$;

a second well-type feedback transistor disposed in a second well having a source connected to said bias current source, and a gate and a drain connected together, wherein said second well is connected to $V_{DD}$;

a first well-type differential transistor disposed in a third well having a source connected to both said gate and said drain of said first well-type feedback transistor, a gate connected to Ground and a drain, wherein said third well is connected to a first voltage input node and is electrically isolated from both said first well and said second well;

a second well-type differential transistor disposed in a fourth well having a source connected to both said gate and said drain of said second well-type feedback transistor, a gate connected to Ground and a drain, wherein said fourth well is connected to a second voltage input node and is electrically isolated from both said first well, said second well and said third well;

a first native feedback transistor having a gate and a drain connected together and to said drain of said first well-type differential transistor, and a source connected to Ground;

a second native feedback transistor having a gate and a drain connected together and to said drain of said second well-type differential transistor, and a source connected to Ground;

a first output node connected to said gate and said drain of said first native feedback transistor; and a second output node connected to said gate and said drain of said second native feedback transistor.

7. A transconductance amplifier disposed in a semiconductor body of a first conductivity type, said transconductance amplifier comprising:

a bias current source;

a first well-type differential transistor disposed in a first well having a source connected to said bias current source, and a gate and a drain connected together, wherein said first well is connected to a first voltage input node;

a second well-type differential transistor disposed in a second well having a source connected to said bias current source, and a gate and a drain connected together, wherein said second well is connected to a second voltage input node;

a first native feedback transistor having a gate and a drain connected together and to both said gate and said drain of said first well-type differential transistor, and a source connected to Ground;

a second native feedback transistor having a gate and a drain connected together and to both said gate and said drain of said second well-type differential transistor, and a source connected to Ground;

a first well-type current mirror transistor disposed in a third well having a source connected to $V_{DD}$, and a gate and a drain connected together, wherein said third well is connected to $V_{DD}$ and is electrically isolated from both said first well and said second well;

a second well-type current mirror transistor disposed in a fourth well having a source connected to an offset voltage power supply, a gate connected to said gate of said first well-type current mirror transistor, and a drain connected to an output terminal, wherein said fourth well is connected to $V_{DD}$ and is electrically isolated from both said first well and said second well;

a first native current mirror transistor having a drain connected to said gate and said drain of said first well-type current mirror transistor, a gate connected to said gate and said drain of said first native feedback transistor, and a source connected to Ground; and a second native current mirror transistor having a drain connected to said output terminal, a gate connected to said gate and said drain of said second native feedback transistor, and a source connected to Ground.

8. A transconductance amplifier disposed in a semiconductor substrate, said transconductance amplifier comprising:

a bias current source;

a first well-type feedback transistor disposed in a first well having a source connected to said bias current source, and a gate and a drain connected together, wherein said first well is connected to $V_{DD}$;

a second well-type feedback transistor disposed in a second well having a source connected to said bias current source, and a gate and a drain connected together, wherein said second well is connected to $V_{DD}$;

a first well-type differential transistor disposed in a third well having a source connected to both said gate and said drain of said first well-type feedback transistor, and a gate and a drain connected together, wherein said third well is connected to a first voltage input node and is electrically isolated from both said first well and said second well;

a second well-type differential transistor disposed in a fourth well having a source connected to both said gate and said drain of said second well-type feedback transistor, and a gate and a drain connected together, wherein said fourth well is connected to a second voltage input node and is electrically isolated from both said first well, said second well, and said third well;

a first native feedback transistor having a gate and a drain connected together and to both said gate and said drain of said first well-type differential transistor, and a source connected to Ground;

a second native feedback transistor having a gate and a drain connected together and to both said gate and said drain of said second well-type differential transistor, and a source connected to Ground;

a first well-type current mirror transistor disposed in a fifth well having a source connected to $V_{DD}$ and a gate and a drain connected together, wherein said fifth well is connected to $V_{DD}$ and is electrically isolated from both said third well and said fourth well;

a second well-type current mirror transistor disposed in a sixth well having a source connected to an offset voltage power supply, a gate connected to said gate of said first well-type current mirror transistor, and a drain connected to an output terminal, wherein said sixth well is connected to $V_{DD}$ and is electrically isolated from both said third well and said fourth well;

a first native current mirror transistor having a drain connected to said gate of said first well-type current mirror transistor, a gate connected to said gate and said drain of said first native feedback transistor, and a source connected Ground; and a second native current mirror transistor having a drain connected to said output terminal, a gate connected to said gate and said drain of said second native feedback transistor, and a source connected to Ground.

9. A transconductance amplifier disposed in a semiconductor substrate, said transconductance amplifier comprising:

a bias current source;

a first well-type feedback transistor disposed in a first well having a source connected to said bias current source, and a gate and a drain connected together, wherein said first well is connected to $V_{DD}$;

a second well-type feedback transistor disposed in a second well having a source connected to said bias current source, and a gate and a drain connected together, wherein said second well is connected to $V_{DD}$;

a first well-type differential transistor disposed in a third well having a source connected to both said gate and said drain of said first native feedback transistor, a gate connected Ground, and a drain, wherein said third well is connected to a first voltage input node and is electrically isolated from both said first well and said second well;

a second well-type differential transistor disposed in a fourth well having a source connected to both said gate and said drain of said second well-type feedback transistor, a gate connected to said Ground, and a drain, wherein said fourth well is connected to a second voltage input node and is electrically isolated from both said first well, and said second well and said third well;

a first native feedback transistor having a gate and a drain connected together and to said drain of said first well-type differential transistor, and a source connected to Ground;

a second native feedback transistor having a gate and a drain connected together and to said drain of said second well-type differential transistor, and a source connected to Ground;

a first well-type current mirror transistor disposed in a fifth well having a source connected to $V_{DD}$, and a gate and a drain connected together, wherein said fifth well is connected to $V_{DD}$ and is electrically isolated from both said third well and said fourth well;

a second well-type current mirror transistor disposed in a sixth well having a source connected to an offset voltage power supply, a gate connected to said gate of said first well-type current mirror transistor, and a drain connected to an output terminal, wherein said sixth well is connected to $V_{DD}$ and is electrically isolated from both said third well and said fourth well;

a first native current mirror transistor having a drain connected to said gate and said drain of said first well-type current mirror transistor, a gate connected to said gate and said drain of said first native feedback transistor, and a source connected to Ground; and a second native current mirror transistor having a drain connected to said output terminal, a gate connected to said gate and said drain of said second native feedback transistor, and a source connected to Ground.

* * * * *

UNITED STATES PATENT AND TRADEMARK OFFICE
CERTIFICATE OF CORRECTION

PATENT NO. : 5,463,348
DATED : October 31, 1995
INVENTOR(S) : Rahul Sarpeshkar, Carver A. Mead It is certified that error appears in the above-indentified patent and that said Letters Patent is hereby corrected as shown below:

Column 1, line 1, replace "CM OS" with --CMOS--.

Column 1, line 27, replace "I.E.E.E.J." with --I.E.E.E. J.--.

Column 1, line 33, replace "448- 450" with --448-450--.

Column 7, line 7, replace "prefer red" with --preferred--.

Column 11, line 23, after "to" insert --VDD--.

Signed and Sealed this

Sixth Day of August, 1996

Attest:

BRUCE LEHMAN

*Attesting Officer*     Commissioner of Patents and Trademarks